United States Patent
Chung et al.

(10) Patent No.: US 8,486,760 B2
(45) Date of Patent: Jul. 16, 2013

(54) METHOD OF MANUFACTURING SUBSTRATE FOR FLIP CHIP AND SUBSTRATE FOR FLIP CHIP MANUFACTURED USING THE SAME

(75) Inventors: Tae Joon Chung, Seoul (KR); Jin Won Choi, Gyunggi-do (KR); Dong Gyu Lee, Gyunggi-do (KR); Hueng Jae Oh, Gyunggi-do (KR); Seon Jae Mun, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 310 days.

(21) Appl. No.: 12/923,621

(22) Filed: Sep. 29, 2010

(65) Prior Publication Data

US 2011/0079926 A1 Apr. 7, 2011

(30) Foreign Application Priority Data

Oct. 1, 2009 (KR) .................. 10-2009-0094119

(51) Int. Cl.
*H01L 23/522* (2006.01)
(52) U.S. Cl.
USPC ............... 438/108; 438/614; 257/E23.143; 257/E21.575
(58) Field of Classification Search
USPC ............ 438/614, 125, 612, 622, 613, 615, 438/626, 631, 632, 652, 661; 257/737
See application file for complete search history.

(56) References Cited

U.S. PATENT DOCUMENTS

| 7,268,438 B2 * | 9/2007 | Nishiyama et al. | 257/780 |
| 2004/0007779 A1 * | 1/2004 | Arbuthnot et al. | 257/780 |
| 2010/0314161 A1 * | 12/2010 | Oh et al. | 174/257 |

FOREIGN PATENT DOCUMENTS

| JP | 9-252003 | 9/1997 |
| KR | 2000-0036297 | 7/2000 |
| KR | 10-2005-0052109 | 6/2005 |
| KR | 10-2009-0080623 A | 7/2009 |

OTHER PUBLICATIONS

Korean Office Action issued Mar. 28, 2011 in corresponding Korean Patent Application 10-2009-0094119.

* cited by examiner

*Primary Examiner* — S. V. Clark
*Assistant Examiner* — Krista Soderholm

(57) ABSTRACT

There is provided a method of manufacturing a substrate for flip chip, and a substrate for flip chip manufactured using the same. The method includes providing a base substrate including at least one conductive pad, forming a solder resist layer on the base substrate, the solder resist layer including a first opening exposing the conductive pad, forming a dry film on the solder resist layer, the dry film including a second opening connected with the first opening, forming a metal post in the first opening and a part of the second opening, filling the second opening above the metal post with solder paste, forming a solder cap by performing a reflow process on the filled solder paste, planarizing a surface of the solder cap, and removing the dry film. Accordingly, fine pitches and improve reliability can be achieved.

11 Claims, 5 Drawing Sheets

US 8,486,760 B2

METHOD OF MANUFACTURING SUBSTRATE FOR FLIP CHIP AND SUBSTRATE FOR FLIP CHIP MANUFACTURED USING THE SAME

CROSS-REFERENCE TO RELATED APPLICATIONS

This application claims the priority of Korean Patent Application No. 10-2009-0094119 filed on Oct. 1, 2009, in the Korean Intellectual Property Office, the disclosure of which is incorporated herein by reference.

BACKGROUND OF THE INVENTION

1. Field of the Invention

The present invention relates to a method of manufacturing a substrate for flip chip, and a substrate for flip chip manufactured using the same, and more particularly, to a substrate for flip chip, capable of realizing fine pitches and ensuring improved reliability, and a method of manufacturing the same.

2. Description of the Related Art

The recent development of the electronic industries has increased the demand for smaller electronic components capable of implementing higher performance and having higher functionality. In this respect, even substrates for surface-mounting components, such as System In Package (SIP) and 3-dimensional (3D) packages, have been required to meet the conditions of high integration, slimness and fine circuit patterns.

Notably, as to surface-mounting on substrates for electronic products, a wire bonding or flip-chip bonding method is in use for an electrical connection between semiconductor chips and printed circuit boards. Here, the flip chip bonding method is considered advantageous over the wire bonding method that brings about an increase in module size, requires additional processes and has limitations in implementing fine pitches in circuit patterns due to the use of wires for a connection with printed circuit boards.

As for the flip-chip bonding method, external connection terminals (i.e., bumps) of tens to hundreds of micrometers in size are formed on a semiconductor chip by using gold, solder, other metallic materials or the like. The semiconductor chip, provided with these bumps, is then flipped over such that its surface faces a substrate, contrary to a mounting method adopting the existing wire bonding technique.

This flip-chip bonding method has evolved from a connection process using existing solder into a connection process using conductive adhesives. Here, the connection process using conductive adhesives desirably requires low costs, and allows for the formation of ultra-fine pitches and the execution of fluxless eco-friendly processes and low-temperature processes.

The flip-chip bonding method using conductive adhesives includes forming bumps, having a uniform height, on a pad, applying an adhesive that contains conductive particles, and bonding a chip with a substrate.

However, among the above-described processes of the flip-chip method, the bump forming technique is disadvantageous in that bumps with desired height need to be selectively formed on each fine pad.

Furthermore, process-wise, the flip-chip bonding method causes inconvenience since bumps need to be formed on both a chip and a substrate for bonding therebetween.

SUMMARY OF THE INVENTION

An aspect of the present invention provides a method of manufacturing a substrate for flip chip, capable of realizing fine pitches and ensuring improved reliability, and a substrate for flip chip manufactured using the same.

An aspect of the present invention also provides a method of manufacturing a substrate for flip chip, including a metal post applicable to a package substrate as well as a semiconductor substrate, and a substrate for flip chip manufactured using the same.

According to an aspect of the present invention, there is provided a method of manufacturing a substrate for flip chip, the method including: providing a base substrate including at least one conductive pad; forming a solder resist layer on the base substrate, the solder resist layer including a first opening exposing the conductive pad; forming a dry film on the solder resist layer, the dry film including a second opening connected with the first opening; forming a metal post in the first opening and a part of the second opening; filling the second opening above the metal post with solder paste; forming a solder cap by performing a reflow process on the filled solder paste; planarizing a surface of the solder cap; and removing the dry film.

The metal post may be formed to satisfy a condition of H/D>1 where H denotes a height of the metal post and D denotes a diameter of the metal post.

The metal post may be formed to have a height of 50 μm or greater.

The metal post may be formed by using electroless plating.

The method may further include forming a seed layer for plating on the solder resist layer after the forming of the solder resist layer.

The metal post may be formed by using an electro-plating method.

The method may further include removing the seed layer for plating after the removing of the dry film.

The method may further include performing a deflux process on the solder cap after the forming of the solder cap.

According to another aspect of the present invention, there is provided a substrate for flip chip, the substrate including: a base substrate including at least one conductive pad; a solder resist layer formed on the base substrate and having an opening exposing the conductive pad; a metal post filling at least a part of the opening; and a solder cap formed on the metal post and having a planarized surface.

The metal post may satisfy a condition of H/D>1 where H denotes a height of the metal post and D denotes a diameter of the metal post.

The metal post may have a height of 50 μm or greater.

The metal post may be formed by an electroless plating method.

The substrate may further include a seed layer for plating on an interface between the opening and the metal post within the opening.

The metal post may be formed by using an electro-plating method.

According to another aspect of the present invention, there is provided a method of manufacturing a package substrate, the method including: providing a base substrate including at least one conductive pad; forming a solder resist layer on the base substrate, the solder resist layer including a first opening exposing the conductive pad; forming a dry film on the solder resist layer, the dry film including a second opening connected with the first opening; forming a metal post in the first opening and a part of the second opening; filling the second opening above the metal post with solder paste; forming a solder cap by performing a reflow process on the filled solder paste; planarizing a surface of the solder cap; removing the dry film; providing a chip substrate including at least one metal pad; and bonding the base substrate with the chip substrate such that the solder cap having the planarized surface corresponds to the metal pad.

The metal post may be formed to satisfy a condition H/D>1 where H denotes a height of the metal post and D denotes a diameter of the metal post.

The metal post may be formed to have a height of 50 μm or greater.

According to another aspect of the present invention, there is provided a package substrate including: a base substrate including at least one conductive pad; a solder resist layer formed on the base substrate and having an opening exposing the conductive pad; a metal post filling at least a part of the opening; a solder cap formed on the metal post and having a planarized surface; and a chip substrate including at least one metal pad and bonded with the base substrate such that the metal pad corresponds to the solder cap having the planarized surface.

The metal post may satisfy a condition of H/D>1 where H denotes a height of the metal post and D denotes a diameter of the metal post.

The metal post may have a height of 50 μm or greater.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
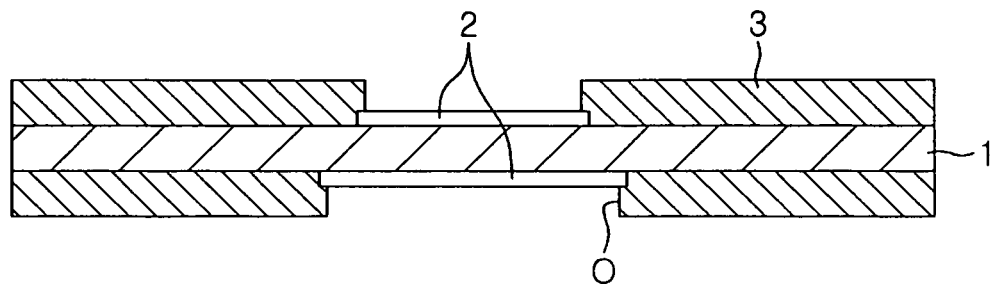
FIGS. 1A through 1I are schematic cross-sectional views illustrating the process of manufacturing a substrate for flip chip according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and sizes of elements may be exaggerated for clarity. Like reference numerals in the drawings denote like elements.

Hereinafter, the process of manufacturing a substrate for flip chip including a metal post, according to an exemplary embodiment of the present invention, will be described.

FIGS. 1A through 1I are schematic cross-sectional views illustrating the process of manufacturing a substrate for flip chip, according to an exemplary embodiment of the present invention.

As shown in FIG. 1A, at least one conductive pad 2 is formed on a prepared base substrate 1. Here, the conductive pad 2 may be formed by using a photolithography process. The base substrate 1 may utilize a semiconductor substrate or a package substrate.

A photosensitive resin layer (not shown) is applied on the base substrate 1 including a conductive pad material (not shown) applied thereon. Subsequently, the conductive pad 2 may be formed by using the photolithography process for exposing and developing the applied photosensitive resin layer using a mask (not shown) having a predetermined pattern.

Thereafter, a solder resist layer 3, having a first opening V1 (not shown) exposing the conductive pad 2, is formed on the base substrate 1 including the conductive pad 2.

Here, the first opening V1 may be formed by exposing and developing a solder resist layer 3, applied on the base substrate 1, by using a predetermined mask pattern (not shown).

Also, an opening "O", corresponding to a solder pad connected to a mother board or the like, may be then formed.

Figure 1B:
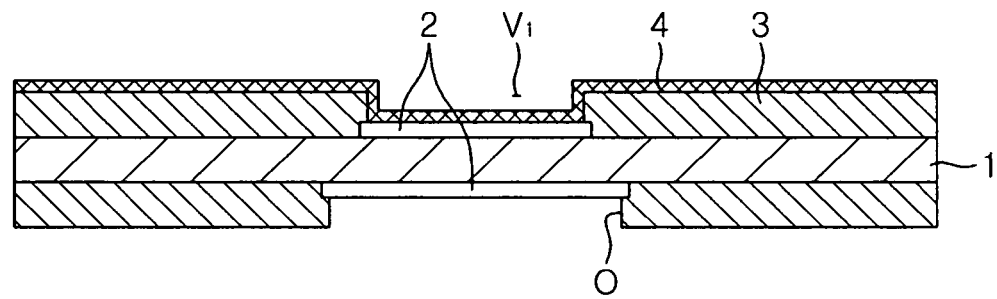

Subsequently, as shown in FIG. 1B, a seed layer 4 for plating may be formed on the solder resist layer 3. The seed layer 4 for plating may be formed in the case that a metal post 6, depicted in FIG. 1E, is formed using an electro-plating method. The formation method for the metal post 6 is not limited thereto, and an electroless plating method may be used to form the metal post 6. As described above, if the metal post 6 is formed using the electroless plating method, the seed layer 4 for plating may not be formed.

Figure 1C:
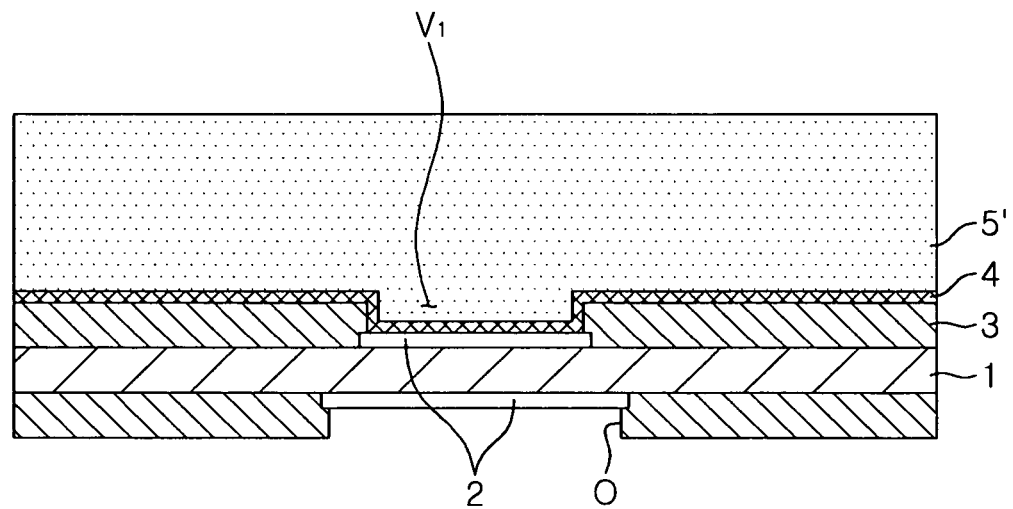

Thereafter, as shown in FIG. 1C, a dry film 5' is applied to the seed layer 4 for plating.

Here, the dry film 5' utilizes a high heat resistant film in order to endure a reflow process performed at a high temperature of 260° C. or higher. In addition, the dry film 5' may have a thickness of 60 μm or greater for the purpose of forming a post bump with an appropriate height.

Figure 1D:
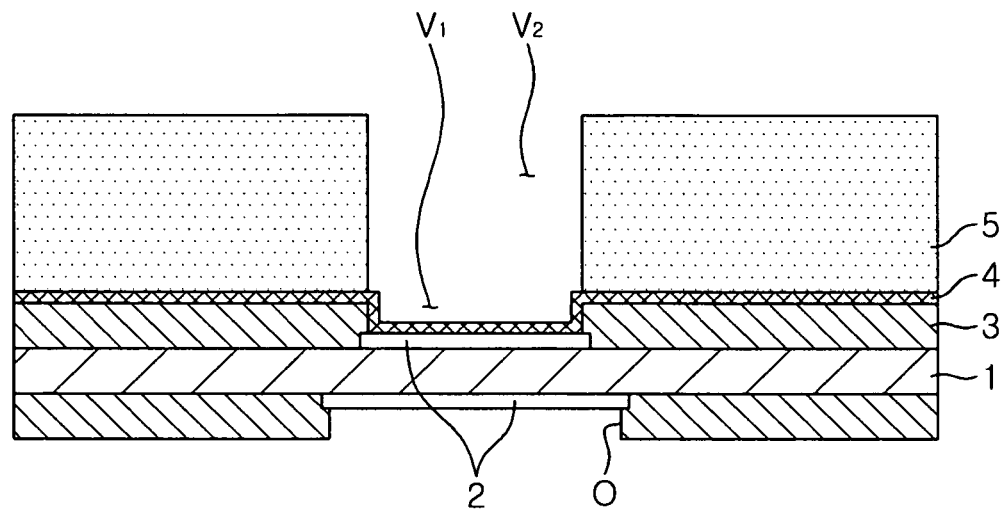
Figure 1E:
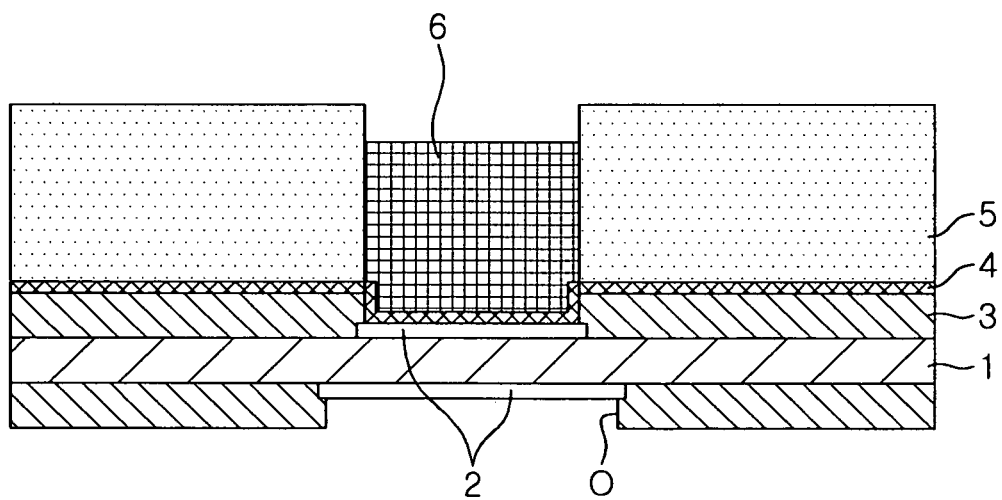

Thereafter, as shown in FIG. 1D, the dry film 5', depicted in FIG. 1C, is subjected to exposing and developing processes, thereby forming a dry film 5 having a second opening V2 communicating (i.e., connected) with the first opening V1.

The second opening V2 may be formed by exposing and developing the photosensitive dry film 5', applied on the seed layer 4 for plating, by using a predetermined mask pattern (not shown), in the same manner as the first opening V1 is formed.

Thereafter, as shown in FIG. 1E, the metal post 6 is formed in the first opening V1 and at least a part of the second opening V2.

At this time, the metal post 6 may be formed by using an electro-plating method or an electroless plating method.

The metal post 6 fills the first opening V1 and a part of the second opening V2 in order to cause wiring patterns to have fine pitches, enable high-speed signal transmissions between a substrate and a semiconductor chip, ensure a sufficient interval between chips, and perform a heat dissipation function. In this case, the metal post 6 may have a cylindrical structure. Also, the metal post 6 may be formed of a conductive material such as copper (Cu). However, the material of the metal post 6 is not limited to the material described, and may utilize nickel (Ni), tin (Sn), gold (Au) or the like.

Here, the metal post 6, when formed of copper, can lower the overall electrical resistance of the substrate 1 for flip chip due to the low resistance of copper, and can also enhance heat dissipation characteristics. Furthermore, the flexural deformation of the substrate 10 for flip chip can be prevented since copper is a metal with a relatively high level of rigidity and thus can retain its rigidity even after undergoing a plurality of high-temperature processes for forming the substrate 10 for flip chip.

In this case, the height of the metal post 6 is not limited specifically, but may satisfy the condition of H/D>1 where H denotes the height of the metal post and D denotes the diameter of the metal post. The metal post 6 may be formed to have a height of 50 μm or greater. Also, the metal post 6 may be formed to have a diameter of 30 μm or greater.

Figure 1F:
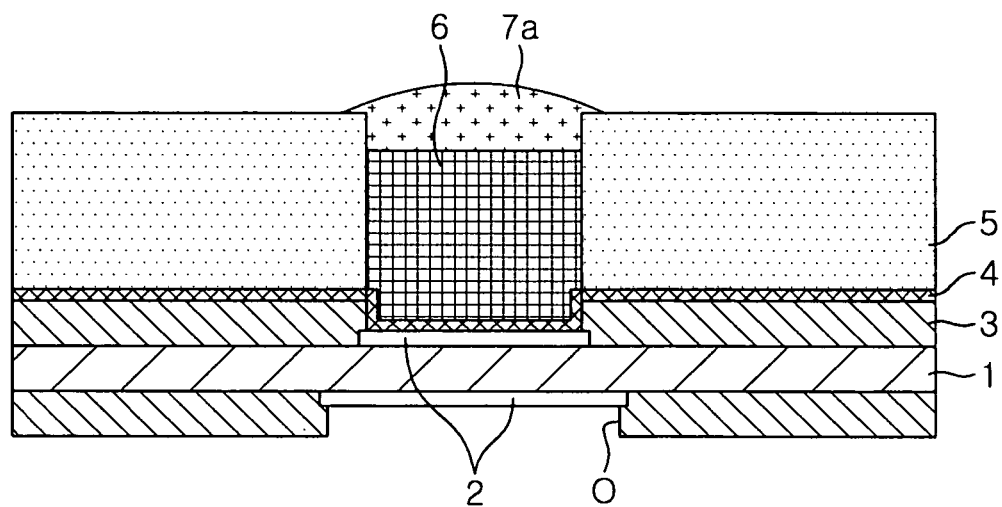

Thereafter, as shown in FIG. 1F, the second opening V2 above the metal post 6 is filled with solder paste. The solder paste is then subject to a reflow processes, thereby forming a solder cap 7a.

In this case, the solder paste may be filled up to a level higher than the second opening V2.

Figure 1G:
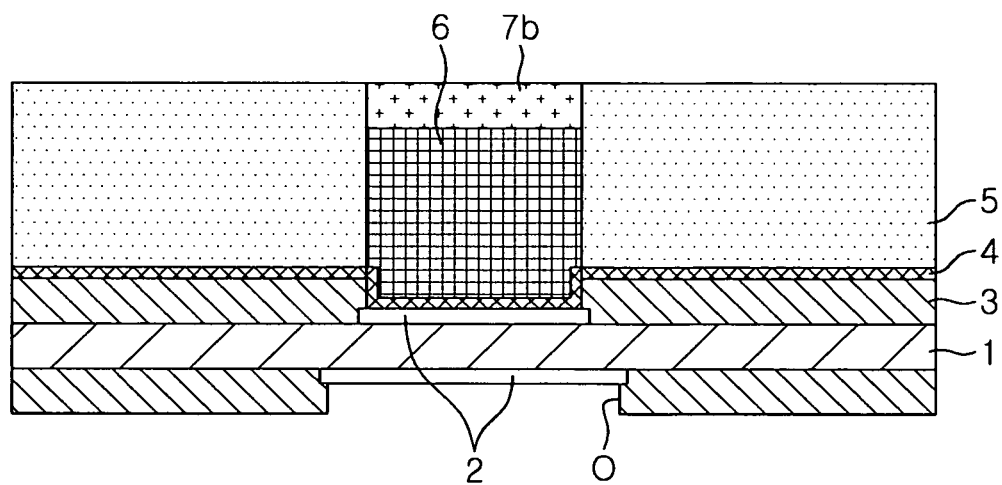

Subsequently, as shown in FIG. 1G, the surface of the solder cap 7a is mechanically or chemically polished to thereby form a planarized solder cap 7b.

Accordingly, the overall height of the metal post 6 and the solder cap 7b can attain uniformity even if the metal post 6 itself has a non-uniform height due to a variation in plating thickness occurring in the previous process of forming the metal post 6.

Namely, the solder cap 7b serves to ensure uniformity in height, as well as to perform a buffering function during a packaging process for the substrate 10 for flip chip.

Thereafter, a typical deflux process is carried out to remove flux remaining on the planarized solder cap 7b.

Figure 1H:
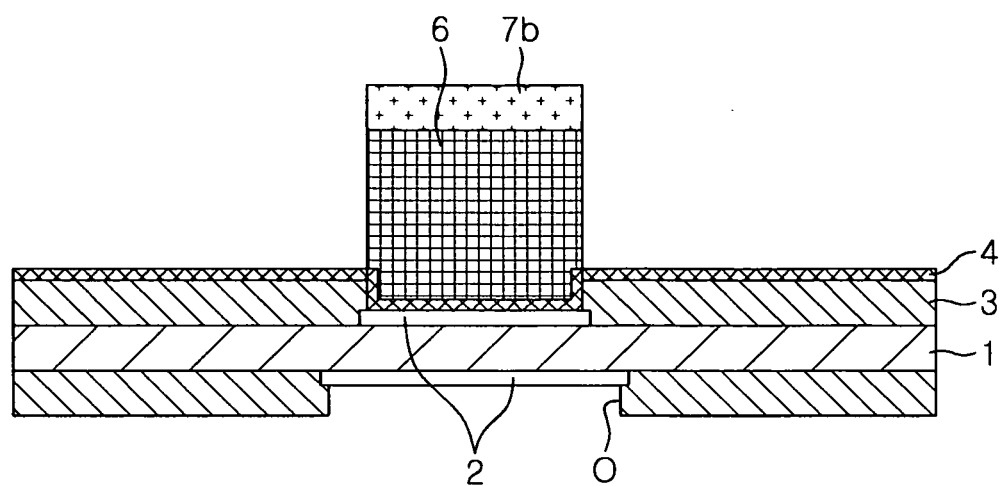

Thereafter, as shown in FIG. 1H, the dry film 5 is stripped off.

Here, the dry film 5 may be removed by causing the dry film 5 on the surface of the base substrate 1 to contact a solvent. As for this contact method, the base substrate 1 may be immersed in a solvent, or a solvent may be sprayed onto the base substrate 1. In addition, the dry film 5 may be removed by controlling the temperature and contact duration with a solvent. Alternatively, the base substrate 1 may be cleaned using ultrasonic waves while being immersed in a solvent. In this case, the time it takes to remove the dry film 5 can be shortened as compared to when the dry film 5 on the surface of the base substrate 1 simply comes in contact with a solvent.

Figure 1I:
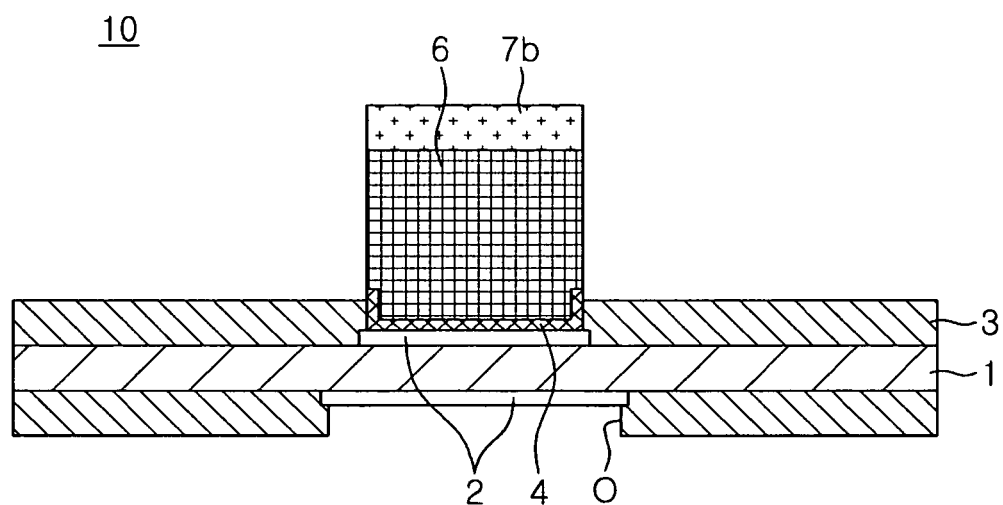

Thereafter, as shown in FIG. 1I, the seed layer 4 for plating is removed to thereby manufacture a substrate 10 for flip chip.

The substrate 10 for flip chip, manufactured according to the process of manufacturing the substrate 10 for flip chip according to an exemplary embodiment of the present invention, includes a base substrate 1 including at least one conductive pad 2, a solder resist layer 3 formed on the base substrate 1 and having a first opening V1 exposing the conductive pad 1, a metal post 6 filling at least a part of the first opening V1, and a solder cap 7b formed on the metal post and having a planarized surface.

Here, the metal post 6 may be formed by an electro-plating method or an electroless plating method.

The metal post 6 serves to enable wiring patterns to have fine pitches, allow for high-speed signal transmission between a substrate and a semiconductor chip, ensure distances between chips, and perform a heat dissipation function. The metal post 6 fills at least a part of the first opening V1. In this case, the metal post 6 may have a cylindrical structure. The metal post 6 may be formed of a conductive material such as copper (Cu), but is not limited thereto. The metal post 6 may be formed of a material such as nickel (Ni), tin (Sn), gold (Au) or the like.

Here, the metal post 6, when formed of copper, may lower the overall electric resistance of the substrate 10 for flip chip due to the low resistance characteristic of copper, and may also improve its heat dissipation characteristic. Since copper is a metal with a high level of rigidity, it can retain its rigidity even after a plurality of high-temperature processes for forming the substrate 10 for flip chip, thereby preventing the flexural deformation of the substrate 10 for flip chip.

The height of the metal post 6 is not limited specifically. However, the metal post 6 may be formed to satisfy the condition of H/D>1 where H denotes the height of the metal post 6, and D denotes the diameter of the metal post 6. Furthermore, the metal post 6 may have a height of 50 μm or greater. Also, the metal post 6 may have a diameter of 30 μm or greater.

The solder cap 7b is a planarized version of the solder cap 7a, which results from the mechanical or chemical polishing of the surface of the solder cap 7a.

Accordingly, even if the height of the metal post 6 is non-uniform due to a variation in plating thickness caused during the previous process of forming the metal post 6, the planarized solder cap 7b may supplement this non-uniformity, and thus allows for the uniformity of the overall height of the metal post 6 and the solder cap 7b.

That is, the solder cap 7b serves to ensure height uniformity, as well as to perform a buffering function during the packaging process of the substrate 10 for flip chip.

According to the present invention, there are provided a substrate for flip chip, enabling the formation of fine pitches and having improved reliability, and a method of manufacturing the same.

Furthermore, the use of the metal post and the solder cap solves the non-uniformity in height and location. Thus, the metal post, capable of providing improved height uniformity and mounting reliability, may be applied not only to a semiconductor substrate but also to a package substrate.

Figure 2A:
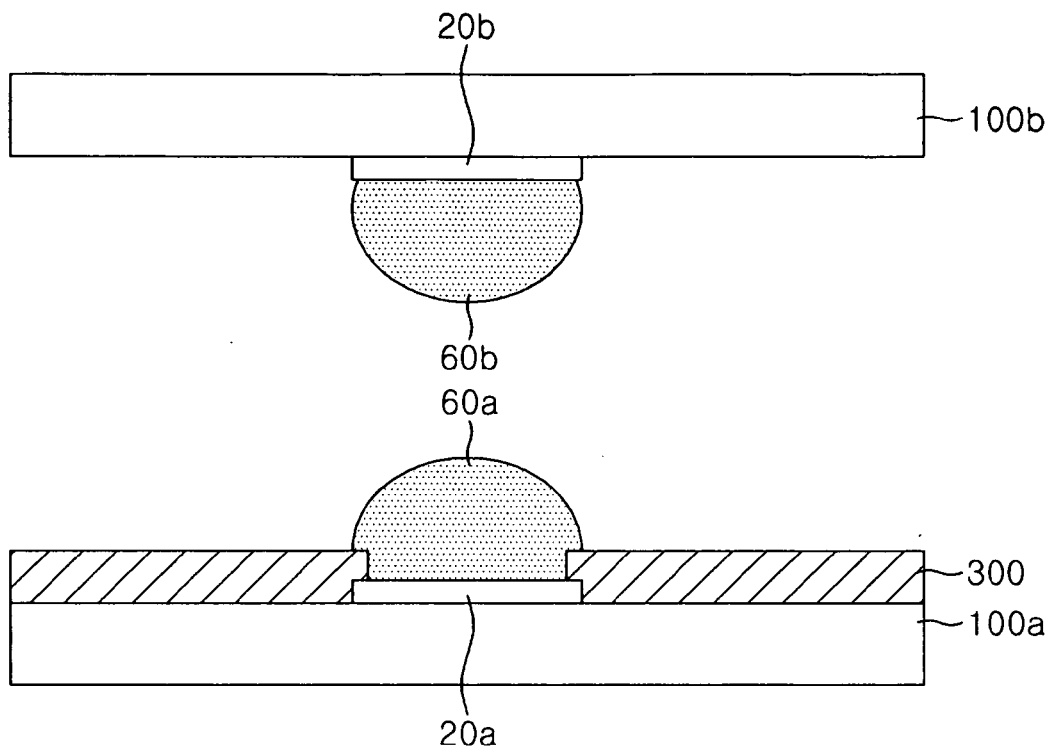
FIGS. 2A and 2B are schematic cross-sectional views for comparing a bonding part between a substrate for flip chip, formed according to an exemplary embodiment of the present invention, and another substrate, with a bonding part between a related art substrate for flip chip and another substrate.
Figure 2B:
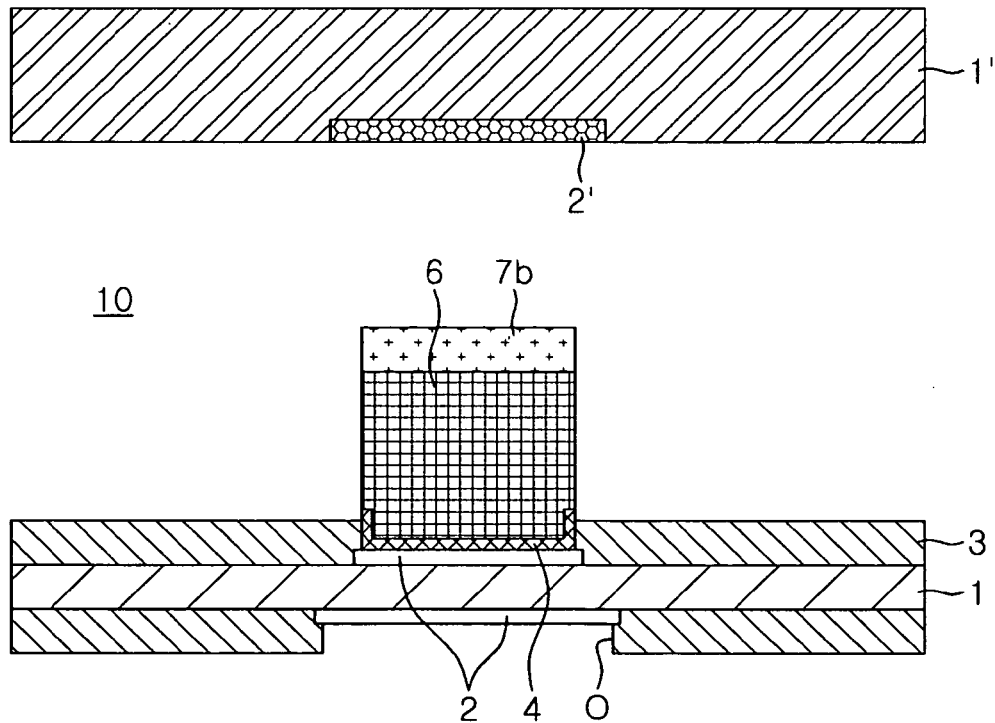

FIGS. 2A and 2B are schematic cross-sectional views for comparing a bonding part between a substrate for flip chip, formed according to an exemplary embodiment of the present invention, and another substrate with a bonding part between a related art substrate for flip chip and another substrate.

Referring to FIG. 2A, a related art substrate 100a, including a solder bump 60a connected with a solder pad 20a in a solder resist layer 300 including an opening, is soldered on a chip substrate 100b. In this case, typically, the chip substrate 100b includes, for the enhancement of assemblage, a metal pad 20b and a solder bump 60a formed on the metal pad 20b, and the chip substrate 100b is then soldered with the substrate 100a.

However, as shown in FIG. 2B, the substrate 10 for flip chip, according to this exemplary embodiment, includes the metal post 6 and the solder cap 7b formed on the metal post 6. Accordingly, when the substrate 10 for flip chip, having the vertically elongated metal post 6 as compared to the related art, is soldered on the metal pad 2' formed on the chip substrate 1', assembly defects can be reduced even without a solder bump formed on the chip substrate 1'.

Accordingly, a defect ratio, involving failed soldering, can be reduced even when solder bumps are not formed on both the substrate 10 for flip chip and another component or a chip substrate. This is contributive to reducing manufacturing costs.

As set forth above, according to exemplary embodiments of the invention, there can be provided the method of manufacturing a substrate for flip chip, capable of achieving fine pitches and improved reliability, and the substrate for flip chip manufactured using the same.

Furthermore, the metal post and the solder cap are used to reduce non-uniformity in height and location. Thus, a package substrate, as well as a semiconductor substrate, can be provided with a metal post allowing for the enhancement of high uniformity and mounting reliability.

Also, defect generation, involving failed soldering, can be reduced even when solder bumps are not formed on both the substrate for flip chip and another component or a chip substrate. This is contributive to reducing manufacturing costs.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a substrate for flip chip, the method comprising:
    providing a base substrate including at least one conductive pad;
    forming a solder resist layer on the base substrate, the solder resist layer including a first opening exposing the conductive pad;
    forming a dry film on the solder resist layer, the dry film including a second opening connected with the first opening;
    forming a metal post in the first opening and a part of the second opening;
    filling the second opening above the metal post with solder paste;
    forming a solder cap by performing a reflow process on the filled solder paste;
    planarizing a surface of the solder cap; and
    removing the dry film.

2. The method of claim 1, wherein the metal post is formed to satisfy a condition of H/D>1 where H denotes a height of the metal post and D denotes a diameter of the metal post.

3. The method of claim 1, wherein the metal post is formed to have a height of 50 μm or greater.

4. The method of claim 1, wherein the metal post is formed by using an electroless plating method.

5. The method of claim 1, further comprising forming a seed layer for plating on the solder resist layer after the forming of the solder resist layer.

6. The method of claim 5, wherein the metal post is formed by using an electro-plating method.

7. The method of claim 1, further comprising removing the seed layer for plating after the removing of the dry film.

8. The method of claim 1, further comprising performing a deflux process on the solder cap after the forming of the solder cap.

9. A method of manufacturing a package substrate, the method comprising:
    providing a base substrate including at least one conductive pad;
    forming a solder resist layer on the base substrate, the solder resist layer including a first opening exposing the conductive pad;
    forming a dry film on the solder resist layer, the dry film including a second opening connected with the first opening;
    forming a metal post in the first opening and a part of the second opening;
    filling the second opening above the metal post with solder paste;
    forming a solder cap by performing a reflow process on the filled solder paste;
    planarizing a surface of the solder cap;
    removing the dry film;
    providing a chip substrate including at least one metal pad; and
    bonding the base substrate with the chip substrate such that the solder cap having the planarized surface corresponds to the metal pad.

10. The method of claim 9, wherein the metal post is formed to satisfy a condition H/D>1 where H denotes a height of the metal post and D denotes a diameter of the metal post.

11. The method of claim 9, wherein the metal post is formed to have a height of 50 μm or greater.

* * * * *